United States Patent [19]

Gurnell et al.

[11] 4,096,511

[45] Jun. 20, 1978

[54] PHOTOCATHODES

[76] Inventors: Philip Gurnell, Letchworth; Michael Charles Rowland, Steeple Morden, both of England

[21] Appl. No.: 309,043

[22] Filed: Nov. 28, 1972

[30] Foreign Application Priority Data

Nov. 29, 1971 United Kingdom ............... 55355/71

[51] Int. Cl.[2] ............................................. H01L 27/14

[52] U.S. Cl. ........................................ 357/30; 313/94; 357/4; 357/16; 357/61

[58] Field of Search .................................... 315/10-12; 148/177, 178, 179; 313/65 R, 65 AB, 65 T, 66, 346, 94; 357/4, 16, 30

[56] References Cited

U.S. PATENT DOCUMENTS

| | | | |
|---|---|---|---|
| 3,350,591 | 10/1967 | Asselt | 313/65 T |
| 3,437,890 | 4/1969 | Krohl et al. | 313/65 AB |
| 3,631,303 | 12/1971 | Antypas | 357/4 |
| 3,696,262 | 10/1972 | Antypas | 357/16 |
| 3,699,401 | 10/1972 | Tietjfn | 357/16 |
| 3,765,962 | 10/1973 | Poleshuk et al. | 313/65 AB |

FOREIGN PATENT DOCUMENTS

| | | |
|---|---|---|
| 1,239,893 | 7/1971 | United Kingdom. |

*Primary Examiner*—Richard E. Schafer
*Assistant Examiner*—Deborah L. Kyle
*Attorney, Agent, or Firm*—Nathan Edelberg; Jeremiah G. Murray; Sheldon Kanars

[57] ABSTRACT

A transmission photodetector operable at wavelengths greater than 0.86 micrometers comprising a substrate transparent to the radiation to be detected, at least one epitaxial intermediate layer comprising $(Ga_{1-x}Al_x)_{1-y}In_yAs$ and an epitaxial p-type $Ga_{1-y}In_yAs$ detector layer. The said one intermediate layer may be p-type. If desired a second epitaxial intermediate layer comprising $(Ga_{1-x}Al_x)_{1-z}In_zAs$ may be provided between the substrate and the said one intermediate layer. In the foregoing $0<x\leqq 1$, $0<y<1$, and $\leqq 0\ z<y$.

6 Claims, 4 Drawing Figures

PHOTOCATHODES

Figure 1:
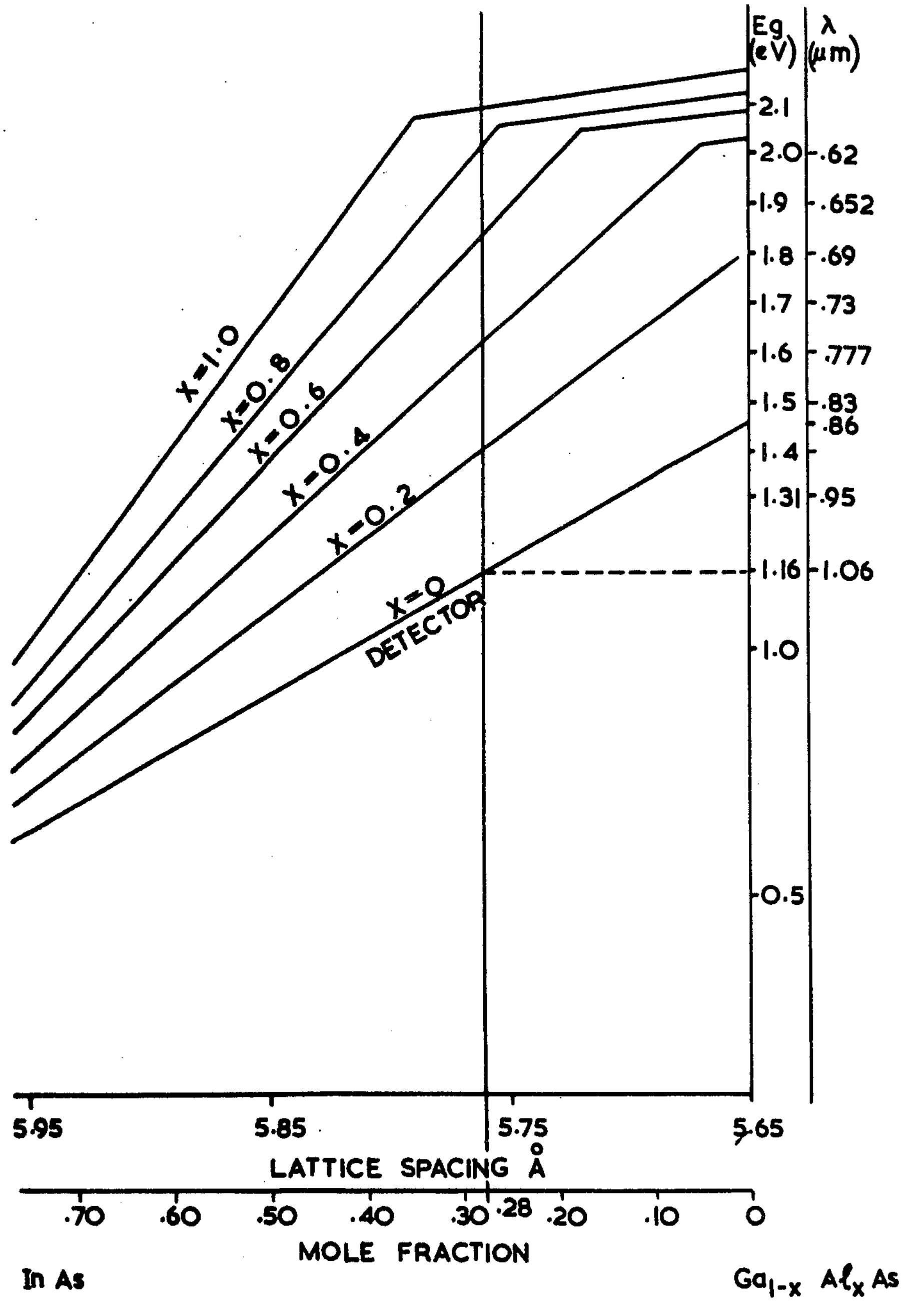

The outstanding problem in the search for semi-transparent photocathode structures operating at wavelengths longer than 0.86 micrometers is to provide a suitable structure for transmission devices supported on a substrate which will not introduce lattice strain in the detector layer by lattice mismatch and consequently ruin the performance of the device.

Accordingly it is a first object of the present invention to provide a transmission photocathode structure for photocathode detectors operable at wavelength greater than 0.86 micrometers.

A second object of the present invention is to provide a transmission photocathode structure operable at wavelengths greater than 0.86 micrometers which may be provided with an appropriate window.

A further object of the invention is to provide a manner of manufacture of such transmission photocathode.

These objects are achieved in a photocathode comprising a substrate transparent to the radiation to be detected, at least one epitaxial intermediate layer comprising $(Ga_{1-x}Al_x)_{1-y}In_yAs$ and an epitaxial p-type $Ga_{1-y}In_yAs$ detector layer wherein $0<x\leqq 1$ and $0<y<1$.

Advantageously a p-type dopant can be provided in said one intermediate layer further enhancing the performance of the photocathode by raising the conduction level in said one intermediate layer so that a potential barrier is provided at the interface with the detector layer preventing the return of photoexcited electrons from the detector layer into the intermediate layer. It has been found that provision of sufficient p-type dopant in said one intermediate layer to produce a potential barrier of about ½ volt at the interface effectively stops all electrons entering the intermediate layer and increases the electron yield by 50%, yet is not sufficient to cause a large increase in the radiation absorption.

The p-type dopant may be zinc, cadmium, germanium, or silicon, although this list is not exclusive.

In the present invention by variations of the aluminium content of said one intermediate layer, the energy gap thereof may be varied and it is possible to provide photocathodes having different windows.

Where it is desired to construct a transmission photocathode in accordance with the invention, particularly a transmission photocathode operable at substantially greater than 0.86 micrometers, it may be desirable to avoid growing a single thick intermediate layer, but to provide a second intermediate layer between said substrate and said one intermediate layer wherein said second intermediate layer comprises $(Ga_{1-x}Al_x)_{1-z}In_zAs$ wherein $0\leqq z<y$.

In another aspect of the invention there is provided a manufacturing process for transmission photocathodes comprising epitaxial deposition of at least one intermediate layer of $(Ga_{1-x}Al_x)_{1-y}In_yAs$ upon a transparent substrate and epitaxial deposition of a p-type $Ga_{1-y}In_yAs$ detector layer upon said one intermediate layer.

Where a second intermediate layer is to be provided the manufacturing process includes epitaxial deposition of said second epitaxial intermediate layer upon the substrate prior to the deposition of the said one intermediate layer, wherein said second intermediate layer is $(Ga_{1-x}Al_x)_{1-z}In_zAs$.

The manufacturing process may be carried out by any of the known techniques for multilayer structural growth, such as horizontal or vertical liquid epitaxy or vapour deposition. The process is completed by providing the exposed detector material surface with a zero or negative electron affinity surface by the known caesiation technique.

Figure 2:
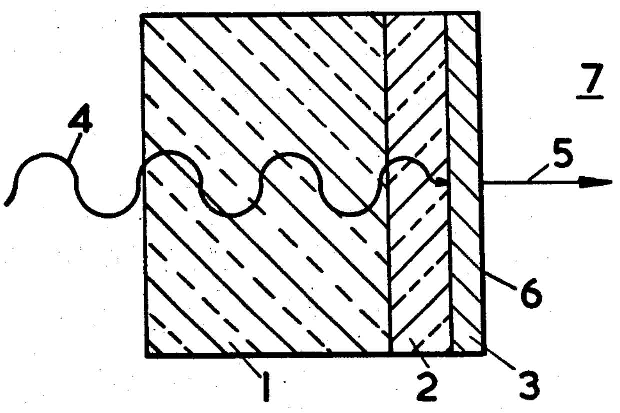
Figure 3:
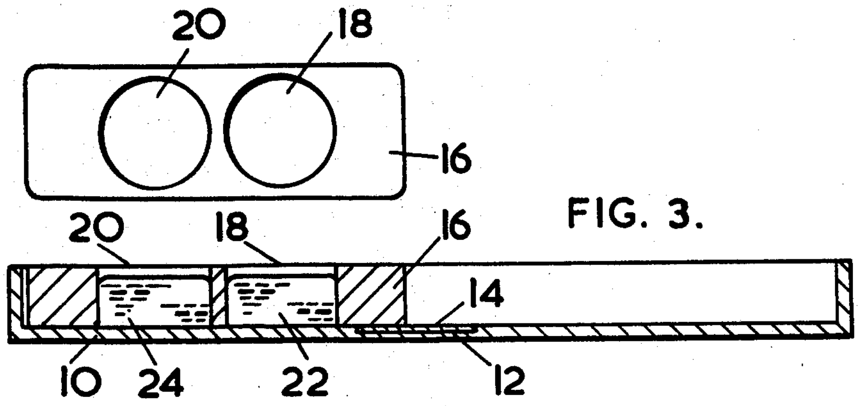
Figure 4:
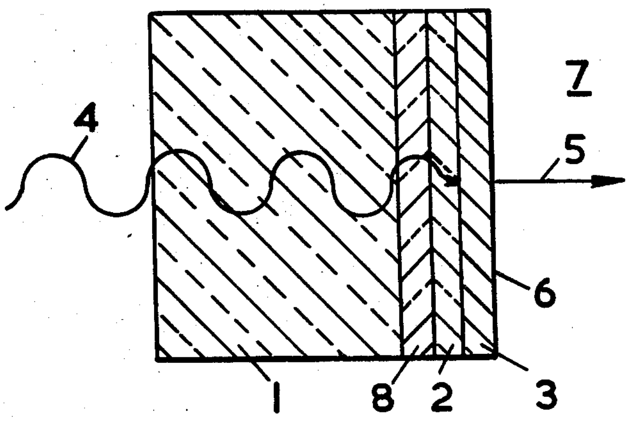

In the drawings which illustrate embodiments of the invention;

FIG. 1 is a graph of energy gap and cut off wavelength for various concentration of aluminium in a quaternary gallium aluminium indium arsenide system demonstrating the principal of selection of the concentration of the various components for the photocathodic or detector and intermediate layers in a photocathode according to the invention having an indium gallium arsenide photocathodic layer, FIG. 2 shows a section through a photocathode according to the invention, FIG. 3 shows a horizontal system for double liquid epitaxy suitable for use with the invention, the lower view showing the boat and slide in longitudinal section and primed ready for use, the upper view is of an empty boat in isolation, and FIG. 4 shows a section through a second photocathode according to the invention In FIG. 1 the horizontal axis plots the mole fraction of indium arsenide in a $Ga_xAl_{1-x}As$ alloy, and the family of curves are for variation of $x$. The lowest curve is for $x = 0$, corresponding to the indium gallium arsenide of the photocathode layer, whilst the highest curve $x = 1$ is for indium aluminium arsenide. Aluminium to arsenic and gallium to arsenic atomic spacings are equal, the lattice spacings of the quaternary alloys formed will be dependent on the indium content and all vertical lines on the graph show alloys of equal lattice spacing. Therefore in order to achieve lattice compatability between the photocathodic or detector layer and the intermediate layer all that is necessary is the introduction of the same atomic percentage of indium into each. Further examination of the graph shows that this system allows the preparation of a wide range of substrate windows with varying cut-offs compatible with one detector response. For example a photocathode to detect radiation at 1.06 micrometers, which is equivalent to a band gap of 1.16eV, requires a value of $y=0.28$ in the $In_yGa_{1-y}As$ system and the isotaxtic vertical line shows that a range of windows with energy gaps from 1.16eV are realizable using $(Ga_{1-x}Al_x)_{1-y}In_yAs$ as an intermediate layer.

Gallium phosphide is the preferred substrate. It will be seen from the graph that for a photocathode to detect, radiation at 1.06 um having an energy gap of 1.16eV the indium gallium arsenide detecting layer would have a lattice spacing of 5.75A as opposed to the lattice spacing of 5.45A in the transparent gallium phosphide substrate. In other systems the difference can be seen to be even more marked. To avoid difficulties of growing a thick layer of a quaternary material intermediate layer, it may be found advantageous to construct a three layer structure on the gallium phosphide substrate, as described with reference to FIG. 3.

In FIG. 2 a transmission photocathode is illustrated wherein a p-type $Ga_{1-y}In_yAs$ detector layer 3 is supported upon a transparent crystalline gallium phosphide substrate 1 about 0.5 mm in thickness. Interposed between the detector layer and substrate is an epitaxial intermediate layer 2 compromising p-type $(Ga_{1-x}Al_x)_{1-y}In_yAs$. The exposed surface 6 of the detector layer has been treated to provide a negative electron affinity, enabling a high percentage of photoexcited electrons released in the detector layer to escape into the surrounding vacuum 7.

In operation of the devices radiation in the far infrared 4 falling upon the transparent substrate 1 passes through both substrate 1 and intermediate layer 2 to be absorbed in the detector layer 3 causing the release of electrons. These photoexcited electrons diffuse to the surface 6 and escape into the surrounding vacuum 7 from whence they may be accelerated to a collector or phosphor screen (which are not shown). The electrons so released are indicated as 5.

One method of manufacture of such a transmission photocathode is illustrated in FIG. 3. The apparatus comprises a carbon boat 10 wherein a carbon slider 16 operates. The length of the slider 16 is somewhat less than the length of the boat 10. Centrally placed in the base of boat 10 is a circular recess 12. The slider 16 has two cylindrical wells 18 and 20, the same diameter as the boat recess 12. Initially the slider 16 is placed at one end of the boat 10 such that neither well overlaps the recess 12.

A suitable gallium phosphide seed crystal 14 is chemically cleaned and placed in recess 12.

A solution 22 is prepared containing gallium, gallium arsenide, aluminium and indium in the proportions required for the selected values of $x$ and $y$ in the formulation $(Ga_{1-x}Al_x)_{1-y}In_yAs$. For example in the case where the detector layer is to be $Ga_{0.72}In_{0.28}As$ the intermediate layer would be $(Ga_{1-x}Al_x)_{0.72}In_{0.28}As$ and values of $x$ can be selected to give a choice of cut off down to a wavelength of 0.58$\mu$m.

A second solution 24 is prepared for the growth of the detector layer. For a detector at 1.06 *m* using a detector layer of p-type $Ga_{0.72}In_{0.28}As$ the composition would be Indium 5.44g; Indium arsenide 7.536g;

Gallium 1.811g; Zinc 0.1g.

Additionally 0.1g zinc is included in solution 22 to provide a p-type intermediate layer.

These solutions are places in the wells 18 and 20 in slider 16, solution 22 in well 18 nearer the seed crystal 14, solution 24 in well 20 further from seed crystal 14. The system is assembled and loaded into a single zone furnace.

Initially the system is flushed for 30 minutes with pure hydrogen. The furnace is then raised to 1000° C, then after 10 minutes taken down to 950° C and left for 20 minutes to stabilise. The system is then programmed to cool at the rate of 80° C/hour and the slide 16 moved within carbon boat 10 to bring well 18 directly above recess 12 and solution 22 into contact with the GaP seed crystal 14. Growth of the intermediate layer commences. After an hour slide 16 is again moved to bring well 20 above recess 12 and solution 24 into contact with the deposited p-type $(Ga_{1-x}Al_x)_{0.72}In_{0.28}As$ on seed crystal 14 and growth of the p-type $Ga_{0.72}I_{0.28}As$ detector layer commences. The growth continues for a few minutes, the actual period depending on the thickness of p-type gallium indium arsenide required, then the solution 24 is swept off and the furnace turned off.

The photocathode thus prepared is heat cleaned by baking in an ultra-high vacuum, and then exposed alternatively to caesium vapour and oxygen until its surface has the correct electron emission properties. This part of the process is identical to that carried out on known photocathodes and further details can be obtained by reference to an Article in Solid State Electronics, vol. 12 (1969) pages 893–901.

Whilst the production of a particular transmission photocathode according to the invention has been described with reference to a horizontal liquid epitaxial system, their manufacture is not limited to this system, for example a vertical liquid epitaxial system or a vapour deposition system might be used to grow the layers.

The transmission photocathode prepared by this process gives an intermediate layer of gallium aluminium indium arsenide which will accommodate the mismatch between the gallium phosphide substrate and p-type gallium indium arsenide detector layer and is at the same time not detrimental to the performance of the device, indeed the transmission photocathodes prepared have been shown to have very much improved characteristics over other known types of transmission photocathodes.

In embodiments of the invention where it is desired to construct a photocathode in which the detector layer has a widely different lattice constant from the substrate and in which difficulties arise in the growth of a sufficiently thick intermediate layer, it may be preferable to include a second intermediate layer between the first and the substrate in which the second intermediate layer has a lattice constant between that of the first intermediate layer and the substrate. This is simply achieved by a reduction of the indium content of this second intermediate layer. This construction is illustrated in FIG. 4, a second epitaxial intermediate layer 8 comprising the tertiary compound $Ga_{1-x}Al_xAs$ has been interposed between a first intermediate layer 2 comprising p-type $(Ga_{1-x}Al_x)_{1-y}In_yAs$ and a GaP substrate 1. Provision may be made in the apparatus illustrated in FIG. 3 for the manufacture of this construction by providing an additional well in the slider. A three stage process is then carried out in which the foregoing example of a p-type $Ga_{1-y}In_yAs$ detector layer would firstly require the epitaxial growth of a $Ga_{1-x}Al_xAs$ layer on the GaP substrate, then the epitaxial growth of p-type $(Ga_{1-x}Al_x)_{1-y}In_yAs$, before final epitaxial growth of the p-type $Ga_{1-y}In_yAs$ detector layer.

We claim:

1. A transmission photocathode comprising:

a crystalline substrate transparent to the radiation to be detected, at least one epitaxial intermediate layer comprising $(Ga_{1-x}Al_x)_{1-y}In_yAs$, and an epitaxial detector layer comprising p-type $Ga_{1-y}In_yAs$ wherein $0<x\leqq 1$ and $0<y<1$.

2. A transmission photocathode comprising:

gallium phosphide as a crystalline substrate transparent to the radiation to be detected, at least one epitaxial intermediate layer comprising $(Ga_{1-x}Al_x)_{1-y}In_yAs$, and an epitaxial detector layer comprising p-type $Ga_{1-y}In_yAs$ wherein $0<x\leqq 1$ and $0<y<1$.

3. A transmission photocathode, according to claim 1, including a potential barrier of up to ½ volt at the interface of said detector layer and said one intermediate layer.

4. A transmission photocathode comprising:

a crystalline substrate transparent to the radiation to be detected, at least one p-type epitaxial intermediate layer comprising $(Ga_{1-x}Al_x)_{1-y}In_yAs$, and an epitaxial detector layer comprising p-type $Ga_{1-y}In_yAs$ wherein $0<x\leqq 1$ and $0<y<1$.

5. A transmission photocathode comprising:

a crystalline substrate transparent to the radiation to be detected, at least one p-type epitaxial intermediate layer comprising $(Ga_{1-x}Al_x)_{1-y}In_yAs$, wherein said p-type dopant is selected from the group consisting of zinc, cadmium, germanium, and silicon, and an epitaxial detector layer comprising p-type $Ga_{1-y}In_yAs$ wherein $0<x\leqq 1$ and $0<y<1$ and wherein said p-type dopant is selected from the group consisting of zinc, cadmium, germanium, and silicon.

6. A transmission photocathode comprising:

gallium phosphide as a crystalline substrate transparent to the radiation to be detected, at least one epitaxial intermediate layer comprising $(Ga_{1-x}Al_x)_{1-y}In_yAs$ and a second epitaxial intermediate layer interposed between said substrate and said one intermediate layer, wherein said second intermediate layer comprises $(Ga_{1-x}Al_x)_{1-z}In_zAs$ and wherein $0\leqq z<y$, and an epitaxial detector layer comprising p-type $Ga_{1-y}In_yAs$ wherein $0<x\leqq 1$ and $0<y<1$.

* * * * *